US006084773A

United States Patent [19]

Nelson et al.

[11] Patent Number: 6,084,773

[45] Date of Patent: Jul. 4, 2000

[54] INTERGRATED PROCESSOR SUBSTRATE PROTECTIVE ENCLOSURE FOR USE IN DESKTOP PC SYSTEMS

[75] Inventors: Daryl Nelson, Beaverton, Oreg.; Michael Stark, Tempe; Michael Rutigliano, Chandler, both of Ariz.; Bill Lieska, Shelton, Wash.

[73] Assignee: Intel Corporation, Santa Clara, Calif.

[21] Appl. No.: 09/024,921

[22] Filed: Feb. 17, 1998

[51] Int. Cl.[7] .......... H05K 7/20

[52] U.S. Cl. .......... 361/704; 361/715; 361/718; 361/737

[58] Field of Search .......... 361/704, 707, 361/709–710, 714–721, 728, 730, 732, 737, 740, 752–754, 756, 759

[56] References Cited

U.S. PATENT DOCUMENTS 5,838,542 11/1998 Nelson et al. .......... 361/704
5,856,910 1/1999 Yurchenco et al. .......... 361/704

*Primary Examiner*—Gregory Thompson
*Attorney, Agent, or Firm*—Blakely, Sokoloff, Taylor & Zafman LLP

[57] ABSTRACT

An electronic cartridge which includes a cover. The cover is coupled to a substrate which has an integrated circuit package. A portion of the cover extends over and is spaced from a plurality of conductive pads located along an edge of the substrate. The conductive pads can be inserted into a card edge electrical connector that is mounted to a motherboard. The cover of the present invention protects the conductive pads while allowing the substrate to be plugged into a card edge connector.

12 Claims, 2 Drawing Sheets

32
38
34
14
16
36
18
12
40
36
22
24
38

42
46
32
44
14
48
24
10'

INTERGRATED PROCESSOR SUBSTRATE PROTECTIVE ENCLOSURE FOR USE IN DESKTOP PC SYSTEMS

BACKGROUND OF THE INVENTION

1. Field of the Invention

The present invention relates to an electronic cartridge that can be plugged into a motherboard connector.

2. Background Information

Integrated circuits are typically assembled into packages that are soldered to a printed circuit board. One edge of the printed circuit board may contain a plurality of conductive pads that can be inserted into an electrical connector. The electrical connector can be mounted to a motherboard of a computer system. For example, memory devices are typically packaged onto a printed circuit board that is plugged into a card edge electrical connector. The conductive pads are exposed until the circuit board is plugged into the connector.

The memory devices can be plugged into the connector by an operator at a manufacturing facility or a consumer end user. The operator or end user may come into contact with the exposed packages and/or conductive pads and create an electrostatic discharge that damages the integrated circuits on the circuit board. It would be desirable to provide a cover for the integrated circuit packages and conductive pads of the printed circuit board. It would also be desirable if such a cover would protect the conductive pads while allowing the printed circuit board to be inserted into a card edge connector.

SUMMARY OF THE INVENTION

One embodiment of the present invention is an electronic cartridge which includes a cover. The cover is coupled to a substrate which has an integrated circuit package. A portion of the cover extends over and is spaced from a conductive pad located along an edge of the substrate.

DETAILED DESCRIPTION OF THE INVENTION

One embodiment of the present invention is an electronic cartridge which includes a cover. The cover is coupled to a substrate which has an integrated circuit package. A portion of the cover extends over and is spaced from a plurality of conductive pads located along an edge of the substrate. The conductive pads can be inserted into a card edge electrical connector that is mounted to a motherboard. The cover of the present invention protects the conductive pads while allowing the substrate to be plugged into a card edge connector. In addition to improving the appearance of the electronic cartridge, the cover also provides a surface which allows a user to plug the assembly into the connector without touching the integrated circuit packages or the substrate.

Figure 1:
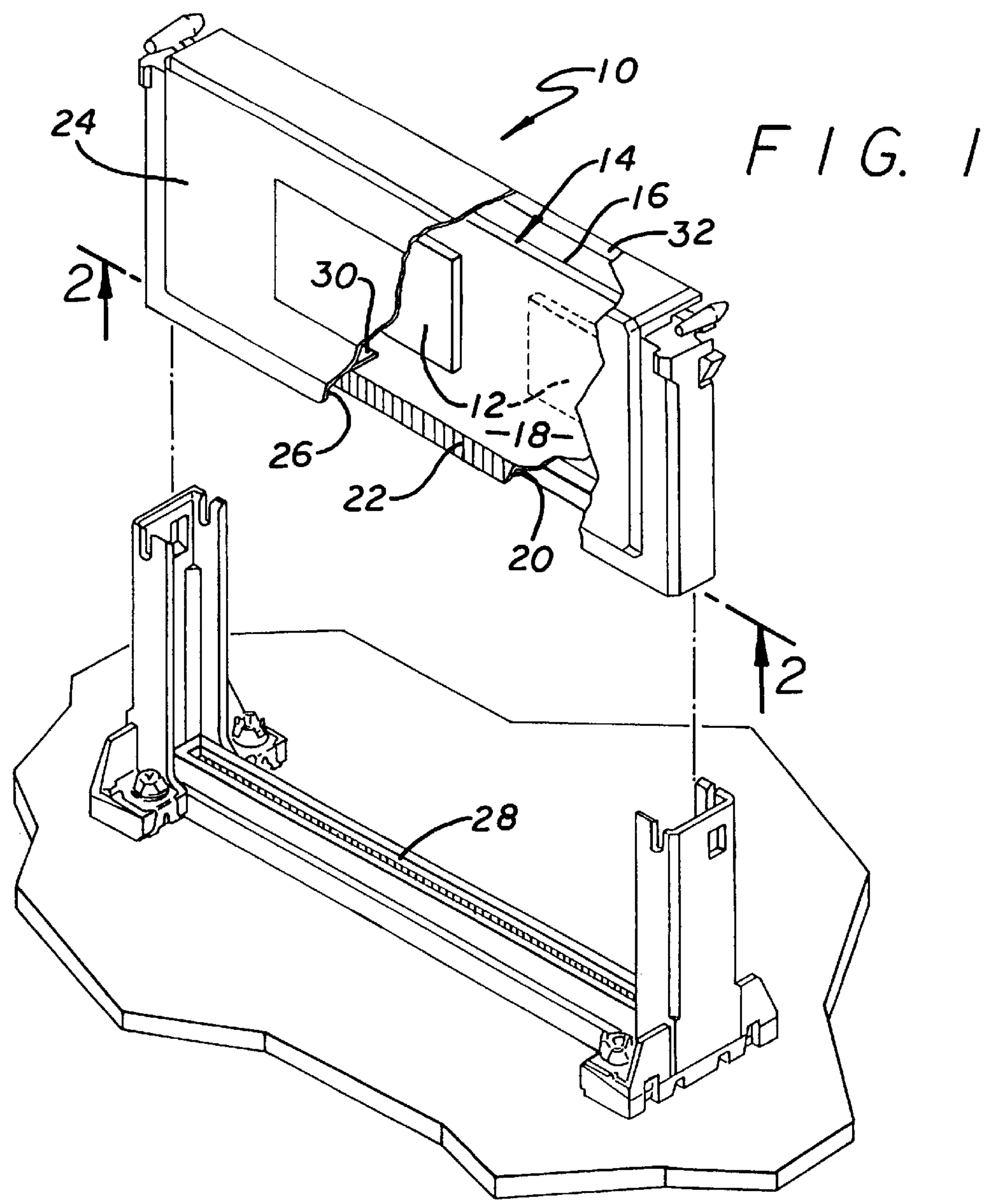
FIG. 1 is a perspective view of an embodiment of an electronic cartridge of the present invention.
Figure 2:
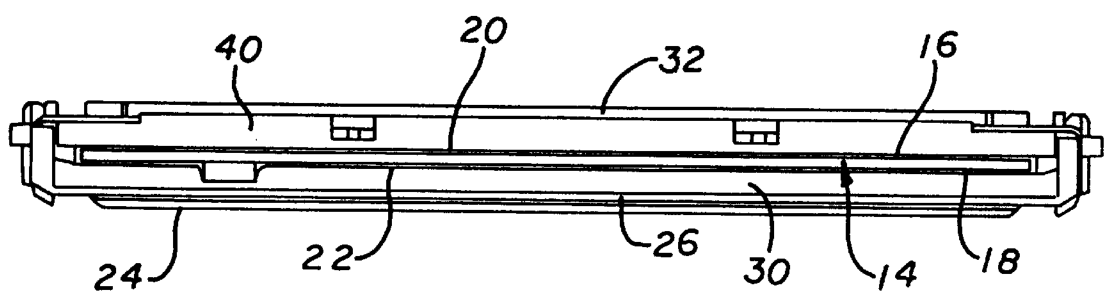
FIG. 2 is a bottom view of the electronic cartridge.
Figure 3:
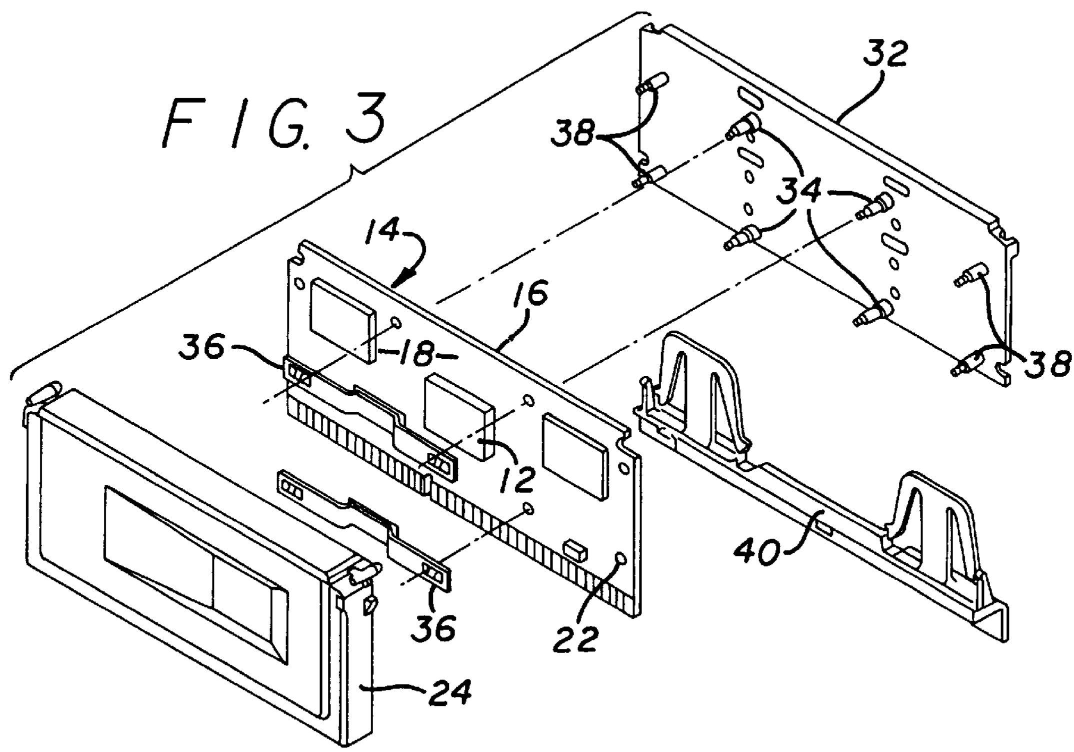
FIG. 3 is an exploded view of the cartridge.

Referring to the drawings more particularly by reference numbers, FIGS. 1–3 show an embodiment of an electronic cartridge 10. The cartridge 10 may include one or more integrated circuit packages 12 that are mounted to a substrate 14. The substrate 14 has a first side 16 and a second side 18. Each package 12 may contain one or more integrated circuits (not shown). The substrate 14 may be a printed circuit board which has surface pads, routing traces, power/ground planes, vias, etc. as is known in the art. The first side 16 of the substrate 14 may have a plurality of first conductive pads 20 located along an edge of the substrate 14. The second side 18 of the substrate 14 may have a plurality of second conductive pads 22.

The cartridge 10 may include a cover 24. The cover 24 may be constructed from a molded plastic material. The cover 24 may have a portion 26 which extends over the second conductive pads 22. The cover portion 26 inhibits human contact with the conductive pads 22. The cover portion 26 is spaced from the conductive pads 22 a sufficient distance to allow the substrate 14 and pads 22 to be inserted into a card edge electrical connector 28. The card edge electrical connector 28 may be mounted to a motherboard (not shown) of a computer system.

The cover 24 may include a rib 30 that extends across the substrate 14. The rib 30 provides structural support for the cover 24. Additionally, the rib 30 and cover 24 enclose the integrated circuit packages 12 located on the second side 18 of the substrate 14.

The cartridge 10 may include a thermal element 32 that is coupled to one or more of the integrated circuit packages 12. The thermal element 32 may be constructed from a thermally conductive material such as aluminum or copper. The thermal element 32 facilitates the removal of heat generated by the integrated circuits within the packages 12. A heat sink (not shown) may be attached to the thermal element 32.

The cartridge 10 may have a plurality of first pins 34 that extend from the thermal element 32 through the substrate 14. The first pins 34 may be attached to a pair of spring clips 36. The pins 34 and clips 36 attach the thermal element 32 to the substrate 14. The spring clips 36 may exert a spring force that pulls the thermal element 32 into one or more of the packages 12.

The cartridge 10 may also have a plurality of second pins 38 that extend through the substrate 14 and are attached to the cover 24. Attaching the cover 24 to the thermal element 32 eliminates the need for additional fasteners on the substrate 14. Eliminating fasteners provides more board space for routing traces, etc.

To minimize the weight of the cartridge 10 the width of the thermal element 32 may be limited to the area adjacent to the integrated circuit packages 12. The thermal element 32 may expose the first conductive pads 20. The cartridge 10 may include a shield 40 that protects the first conductive pads 20. The shield 40 may be spaced from the substrate 14 to allow the pads 20 to be inserted into the connector 28. The shield 40 can be connected to the pins 34 and 38.

Figure 4:
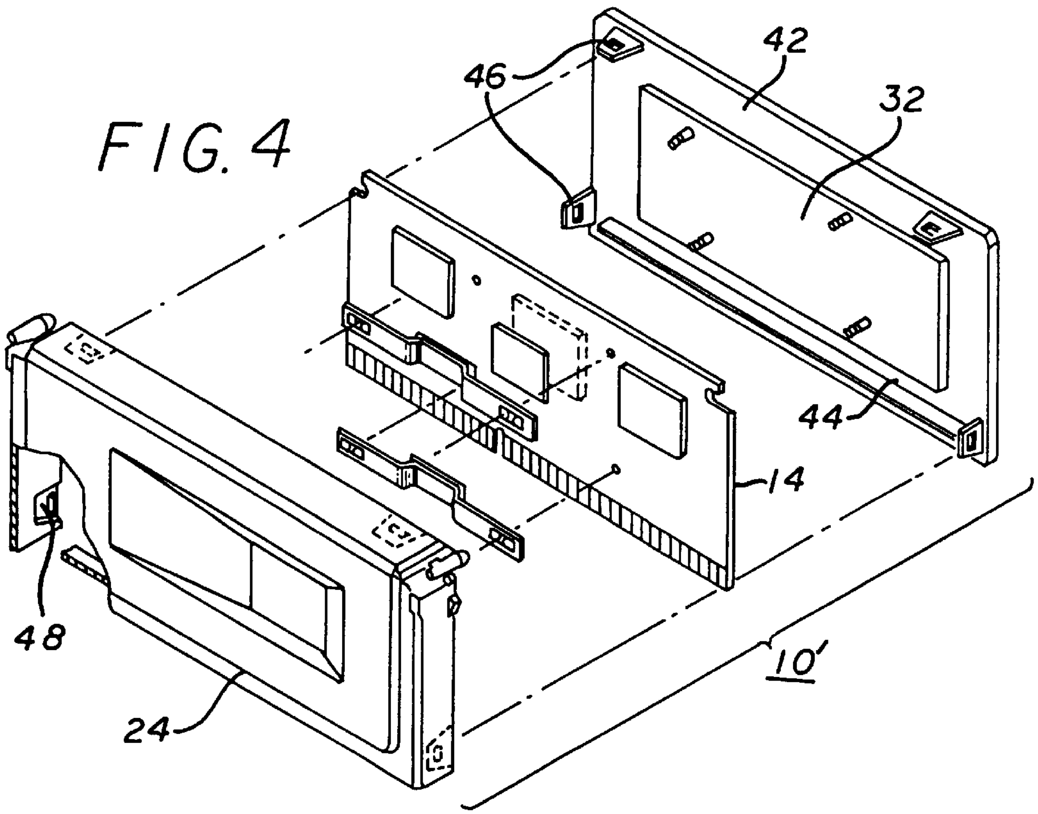
FIG. 4 is an exploded view of an alternate embodiment of the cartridge.

FIG. 4 shows an alternate embodiment of the assembly 10' which has a bezel 42 that extends around the thermal element 32. The bezel 42 may have a portion 44 which protects the first conductive pads 20. The bezel 42 may be constructed from a molded plastic material.

The bezel 42 may have a plurality of tabs 46 that snap into corresponding slots 48 of the cover 24. The tabs 46 and corresponding slots 48 may be located at the corners of the bezel 42 and cover 24, respectively. The snap in tabs 46 allows the bezel 42 to be connected to the cover 24 without any tools, thereby minimizing the complexity of assembling the electronic cartridge 10'.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridge, comprising:

a substrate which has a conductive pad located along a first edge of said substrate, said substrate further having a second edge that intersects said first edge;

an integrated circuit package mounted to said substrate;

a thermal element that is attached to said substrate;

a cover coupled to said substrate, said cover having a portion that extends over and is spaced from said conductive pad; and, a bezel that surrounds said thermal element and is attached to said cover, said bezel includes a tab that extends around said second edge of said substrate and snaps into a corresponding slot in said cover.

2. The cartridge as recited in claim 1, wherein said cover includes a rib that extends across said substrate.

3. The cartridge as recited in claim 1, wherein said cover and said rib enclose said integrated circuit package.

4. The cartridge as recited in claim 1, further comprising a pin that attaches said thermal element to said cover.

5. An electronic cartridge, comprising:

a substrate which has a first side and a second side, said substrate having a first conductive pad located along a first edge of said first side of said substrate, and a second conductive pad located along on edge of said second side of said substrate, said substrate further having a second edge that intersects said first edge;

an integrated circuit package mounted to said substrate;

a thermal element attached to said substrate and located adjacent to said first side of said substrate;

a cover attached to said thermal element and located adjacent to said second side of said substrate, said cover having a portion that extends over and is spaced from said second conductive pad; and, a bezel that surrounds said thermal element and is attached to said cover, said bezel includes a tab that extends around said second edge of said substrate and snaps into a corresponding slot in said cover.

6. The cartridge as recited in claim 5, wherein said cover includes a rib that extends across said substrate.

7. The cartridge as recited in claim 5, wherein said cover and said rib enclose said integrated circuit package.

8. The cartridge as recited in claim 5, further comprising a pin that attaches said thermal element to said cover.

9. An electronic cartridge, comprising:

a substrate that has an edge;

an integrated circuit package mounted to said substrate;

a thermal element attached to said substrate;

a cover attached to said thermal element; and, a bezel that surrounds said thermal element and is attached to said cover, said bezel includes a tab that extends around said edge of said substrate and snaps into a corresponding slot in said cover.

10. The cartridge as recited in claim 9, wherein said cover includes a rib that extends across said substrate.

11. The cartridge as recited in claim 9, wherein said cover and said rib enclose said integrated circuit package.

12. The cartridge as recited in claim 9, further comprising a pin that attaches said thermal element to said cover.

* * * * *